United States Patent
Miller et al.

(10) Patent No.: US 9,646,682 B1
(45) Date of Patent: May 9, 2017

(54) RECIPROCAL QUANTUM LOGIC (RQL) SENSE AMPLIFIER

(71) Applicants: Donald L. Miller, Export, PA (US); Quentin P. Herr, Ellicott City, MD (US); Anna Y. Herr, Ellicott City, MD (US)

(72) Inventors: Donald L. Miller, Export, PA (US); Quentin P. Herr, Ellicott City, MD (US); Anna Y. Herr, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/167,317

(22) Filed: May 27, 2016

(51) Int. Cl.
  *G11C 11/44* (2006.01)
  *G11C 11/16* (2006.01)
  *G11C 5/14* (2006.01)
  *G11C 7/10* (2006.01)

(52) U.S. Cl.
  CPC .............. *G11C 11/44* (2013.01); *G11C 5/147* (2013.01); *G11C 7/1051* (2013.01); *G11C 11/16* (2013.01); *G11C 11/1673* (2013.01)

(58) Field of Classification Search
  CPC ....... G11C 11/44; G11C 11/16; G11C 7/1051; G11C 7/22; G11C 5/147; G11C 5/145
  USPC ....... 365/162, 171, 189.011, 189.15, 189.09, 365/63, 207, 208, 210.1, 202
  See application file for complete search history.

(56) References Cited

U.S. PATENT DOCUMENTS

| | | | | |
|---|---|---|---|---|
| 7,129,869 B2* | 10/2006 | Furuta | ....................... | G11C 7/06 341/126 |
| 7,443,719 B2* | 10/2008 | Kirichenko | .............. | G11C 8/10 365/160 |
| 8,971,977 B2* | 3/2015 | Mukhanov | .............. | G11C 11/44 257/35 |

* cited by examiner

*Primary Examiner* — Gene Auduong
(74) *Attorney, Agent, or Firm* — Tarolli, Sundheim, Covell & Tummino LLP

(57) ABSTRACT

One embodiment describes a reciprocal quantum logic (RQL) sense amplifier system. The system includes an input stage configured to amplify a sense current received at an input. The system also includes a detection stage configured to trigger at least one detection Josephson junction (JJ) in response to the amplified sense current and based on a clock signal to generate a single flux quantum (SFQ) pulse. The system further includes a Josephson transmission line (JTL) stage configured to propagate the SFQ pulse to an output of the RQL sense amplifier system based on at least one output JJ and to generate a negative SFQ pulse to reset the at least one detection JJ and the at least one output JJ based on the clock signal.

20 Claims, 8 Drawing Sheets

US 9,646,682 B1

RECIPROCAL QUANTUM LOGIC (RQL) SENSE AMPLIFIER

TECHNICAL FIELD

The present invention relates generally to quantum and classical digital superconducting circuits, and specifically to a reciprocal quantum logic (RQL) sense amplifier.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts previously considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is done with Josephson devices. However, such a configuration yields only nominally higher performance than standard CMOS and suffers from relatively high power dissipation for a cryogenic environment.

SUMMARY

One embodiment describes a reciprocal quantum logic (RQL) sense amplifier system. The system includes an input stage configured to amplify a sense current received at an input. The system also includes a detection stage configured to trigger at least one detection Josephson junction (JJ) in response to the amplified sense current and based on a clock signal to generate a single flux quantum (SFQ) pulse. The system further includes a Josephson transmission line (JTL) stage configured to propagate the SFQ pulse to an output of the RQL sense amplifier system based on at least one output JJ and to generate a negative SFQ pulse to reset the at least one detection JJ and the at least one output JJ based on the clock signal.

Another embodiment includes a method for reading a memory cell in a reciprocal quantum logic (RQL) memory system. The method includes receiving a sense current from a bit-line, the sense current corresponding to a first logic state associated with the memory cell arranged on the bit-line. The method also includes amplifying the sense current via an input transformer to provide an amplified sense current. The method also includes providing a clock signal to trigger at least one detection JJ in response to the amplified sense current to generate an SFQ pulse. The method also includes providing the clock signal to trigger at least one output JJ associated with an output Josephson JTL to propagate the SFQ pulse to an output of the RQL sense amplifier system to indicate the first logic state. The method further includes providing the clock signal to trigger at least one reset JJ associated with a reset JTL to generate a negative SFQ pulse to reset the at least one detection JJ and the at least one output JJ.

Another embodiment includes a memory system that includes a plurality of memory cells arranged in an array of rows and columns. Each of the columns includes a bias pump configured to generate a bias current that is provided along a bit-line associated with the respective one of the columns. Each of the columns also includes a plurality of memory cells arranged along the respective bit-line, each of the plurality of memory cells being addressed by a word-line current provided on one of a respective plurality of word-lines to generate a sense current in response to storing a first logic state and to not generate the sense current on the bit-line in response to storing a second logic state. Each of the columns also includes an RQL sense amplifier system. The RQL sense amplifier system includes an input stage configured to amplify the sense current line and comprising a resistor to steer the bias current generated by the bias pump to the bit-line. The RQL sense amplifier system also includes a detection stage configured to trigger at least one detection JJ in response to the amplified sense current and based on a clock signal to generate an SFQ pulse. The RQL sense amplifier system further includes a JTL stage configured to propagate the SFQ pulse to an output of the RQL sense amplifier system based on at least one output JJ and to generate a negative SFQ pulse to reset the at least one detection JJ and the at least one output JJ based on the clock signal.

DETAILED DESCRIPTION

The present invention relates generally to quantum and classical digital superconducting circuits, and specifically to reciprocal quantum logic (RQL) sense amplifier. The RQL sense amplifier system can be implemented in a memory system (e.g., a quantum computing memory system) to read a logic state of an addressed memory cell. As an example, the RQL sense amplifier system can be coupled to a bit-line of a column of memory cells, such that based on a given one of the memory cells storing a first logic state that generates a sense current in response to being addressed, the RQL sense amplifier system can receive the sense current and convert the sense current to a single flux quantum (SFQ) pulse (e.g., fluxon) in a classical or quantum computer system, along with a corresponding negative SFQ pulse.

The RQL sense amplifier system includes an input stage that can amplify the sense current. As an example, the sense current can be provided through a primary inductor of an input transformer to generate an induced sense current, and the sense current and induced sense current can be combined at a summation node to generate an amplified sense current. The amplified sense current can be provided to a detection stage that is configured to trigger at least one detection Josephson junction in response to the amplified sense current based on a clock signal. The clock signal can be a quadrature clock signal, such as including an in-phase component and a quadrature-phase component. Thus, the detection stage can provide an SFQ pulse based on the in-phase component (e.g., at a first polarity). The SFQ pulse can be provided to an output Josephson transmission line (JTL) of a JTL stage, such that the SFQ pulse can be propagated at an output of the RQL sense amplifier system (e.g., via the quadrature-phase component of the clock signal). Additionally, the JTL stage can include a reset JTL that is configured to generate a negative SFQ pulse (e.g., via the in-phase component of the clock signal) to reset the Josephson junctions associated with the detection stage and the output JTL.

Figure 1:
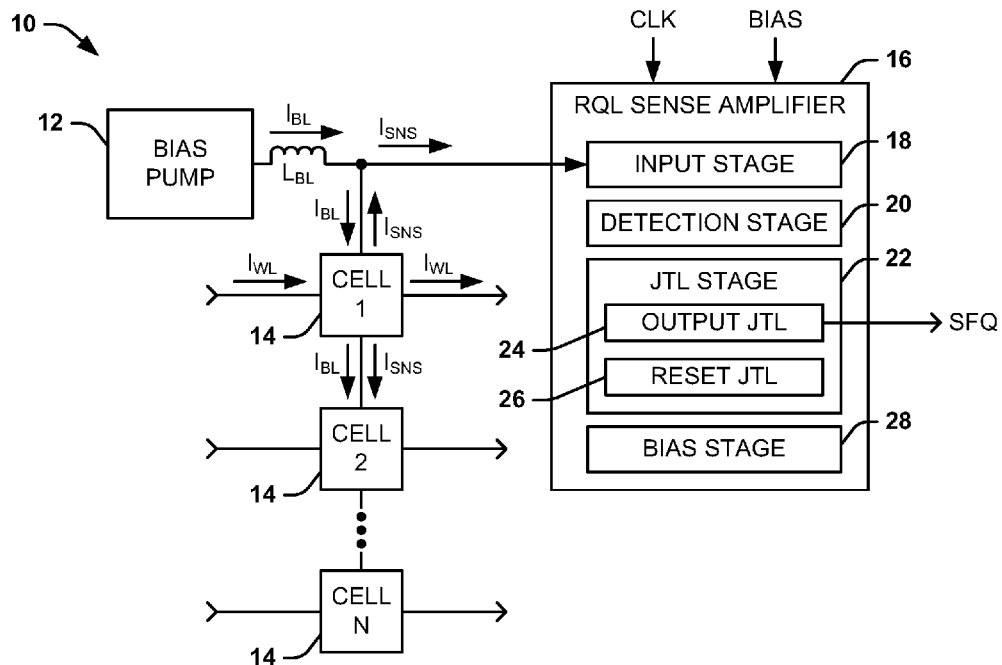
FIG. 1 illustrates an example of a memory system.

FIG. 1 illustrates an example of a memory system 10. The memory system 10 can be implemented in any of a variety of quantum and/or classical computer systems. As an example, the memory system 10 can correspond to any of a variety of memory systems that implement a hysteretic magnetic Josephson junction (e.g., a phase hysteretic magnetic Josephson junction, such as described in Ser. No. 14/854,994, or as described in U.S. Pat. No. 8,270,209; both of which are incorporated herein by reference in their entirety). Thus, in the example of FIG. 1, the memory system 10 includes a bias pump 12 configured to generate a bit-line current $I_{BL}$ that is provided via an inductor LBL on a bit-line that passes through a plurality N of memory cells 14 in a column, where N is a positive integer. As an example, the column of memory cells 14 can be one column of a plurality of columns, such that the memory cells 14 can be part of an array of memory cells 14 arranged in rows and columns. For example, the bias pump 12 can be arranged as a flux-shuttle loop current source to provide the bit-line current $I_{BL}$, and can be one of a plurality of bias pumps 12 in the array of memory cells 14, such that each of the bias pumps 12 can be associated with a given column of the array.

In the example of FIG. 1, one of the memory cells 14, demonstrated as "CELL 1", is addressed for readout of the associated memory state. The respective memory cell 14 is provided a word-line current $I_{WL}$ along with the bit-line current $I_{BL}$ to read the associated memory state (e.g., binary state). In the example of FIG. 1, the respective memory cell 14 stores a first logic state. Because the respective memory cell 14 stores the first logic state (e.g., a logic-1 state), in response to being addressed by the word-line current $I_{WL}$ and the bit-line current $I_{BL}$, the respective memory cell 14 provides a sense current $I_{SNS}$, thus indicating the first logic state. Alternatively, if the respective memory cell 14 had stored a second logic state (e.g., a logic-0 state), in response to being addressed by the word-line current $I_{WL}$ and the bit-line current $I_{BL}$, the respective memory cell 14 could provide no sense current, thus indicating the second logic state.

The sense current $I_{SNS}$ is demonstrated as flowing in both directions on the bit-line away from the respective memory cell 14. Positive current $I_{SNS}$ flows from the memory cell 14 toward the bias pump 12, and negative current $-I_{SNS}$ flows from the memory cell 14 toward the bit column termination 15. The inductor $L_{BL}$ is arranged to substantially prevent the sense current $I_{SNS}$ from flowing into the bias pump 12.

However, the memory system 10 also includes a RQL sense amplifier system 16 that is coupled to the bit-line and configured to receive the sense current $I_{SNS}$. The RQL sense amplifier system 16 is thus configured to convert the sense current $I_{SNS}$ into a single flux quantum (SFQ) pulse (e.g., a fluxon), demonstrated in the example of FIG. 1 as an output signal SFQ. For example, the sense current $I_{SNS}$ can have a very small amplitude (e.g., approximately 10-40 μA), and can be provided in a very small window of time (e.g., less than 20 picoseconds). Thus, the RQL sense amplifier system 16 can be configured to detect the first logic state that is read from the respective memory cell 14 as the sense current $I_{SNS}$ and can convert the sense current $I_{SNS}$ to a data signal for use in an associated computing system.

The RQL sense amplifier system 16 includes an input stage 18 that is configured to receive the sense current $I_{SNS}$ and to amplify the sense current $I_{SNS}$. As an example, the input stage 18 can include an input transformer, such that the sense current $I_{SNS}$ can be provided through a primary inductor of the input transformer to generate an induced sense current, such that the sense current $I_{SNS}$ and the induced sense current can be combined at a summation node to generate an amplified sense current. The RQL sense amplifier system 16 also includes a detection stage 20 that includes at least one detection Josephson junction. The amplified sense current can be provided to the detection stage 20, such that the at least one detection Josephson junction is triggered in response to the amplified sense current based on a clock signal CLK. As an example, the clock signal CLK can be a quadrature clock signal, such as including an in-phase component and a quadrature-phase component. The detection stage 20 can, for example, trigger the at least one detection Josephson junction at a first polarity of the in-phase component (e.g., at a first polarity) to generate an SFQ pulse.

Figure 2:
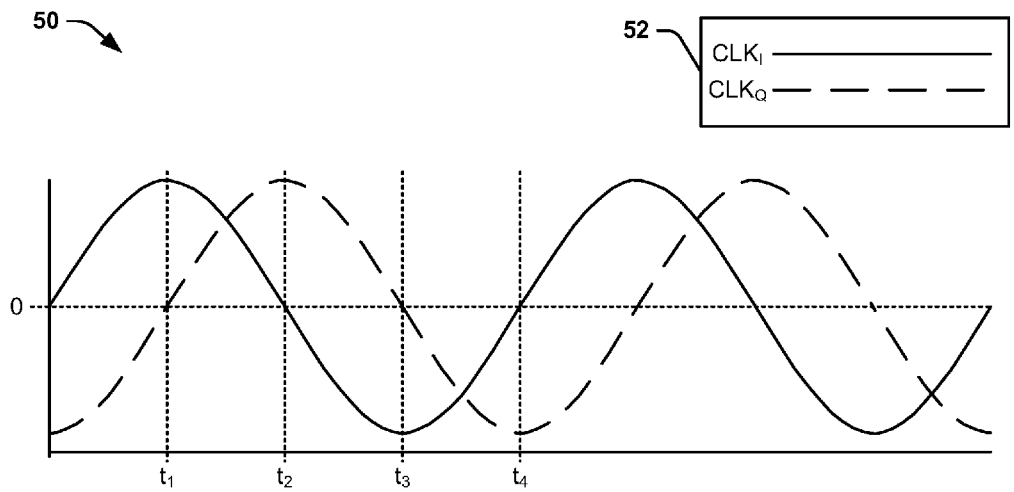
FIG. 2 illustrates an example of a timing diagram.

FIG. 2 illustrates an example of a timing diagram 50. The timing diagram 50 demonstrates the clock signal CLK as a quadrature clock signal. Therefore, the clock signal CLK includes an in-phase component $CLK_I$ and a quadrature-phase component $CLK_Q$, as indicated in a legend 52. Each of the in-phase component $CLK_I$ and the quadrature-phase component $CLK_Q$ have amplitudes that are centered about zero. Thus, the in-phase component $CLK_I$ has a positive polarity that peaks at a time $t_1$ and a negative polarity that peaks at a time $t_3$. Similarly, the quadrature-phase component $CLK_Q$ has a positive polarity that peaks at a time $t_2$ and a negative polarity that peaks at a time $t_4$. Therefore, the in-phase component $CLK_I$ and the quadrature-phase component $CLK_Q$ can collectively correspond to the clock signal CLK, such as can be implemented for the RQL sense amplifier system 16.

Referring back to the example of FIG. 1, the RQL sense amplifier system 16 also includes a Josephson transmission line (JTL) stage 22 that includes an output JTL 24 and a reset JTL 26. The SFQ pulse that is generated by the detection stage 20 can propagate to the output JTL 24 and to the reset JTL 26 based on the clock signal CLK. As an example, the SFQ pulse can propagate through the output JTL 24 to an output (e.g., via the quadrature-phase component of the clock signal CLK), and is thus provided as the output signal SFQ. Additionally, the reset JTL 26 can be configured to generate a negative SFQ pulse (e.g., via the in-phase component of the clock signal CLK) to reset the Josephson junctions associated with the detection stage 20 and the output JTL 24. Thus, the RQL sense amplifier system 16 can detect the first logic state that is read from the respective memory cell 14 as the sense current $I_{SNS}$ and can convert the sense current $I_{SNS}$ to the output signal SFQ for use in the associated computing system.

In addition, the RQL sense amplifier system 16 can have a tunable threshold with respect to detecting the sense current $I_{SNS}$ via the detection stage 20. In the example of FIG. 1, the RQL sense amplifier system 16 includes a bias stage 28 that is configured to set or adjust a threshold of the detection stage 20 with respect to detecting the amplified sense current. For example, the bias stage 28 can include a transformer that interacts with the transformer in the input stage 18 based on a DC bias signal BIAS. For example, the bias signal BIAS can induce a current that is provided through the secondary inductor of the input transformer in the input stage 18, or can induce an additional current magnitude in the secondary inductor of the input transformer of the input stage 18. Accordingly, the bias stage 28 can adjust an amplitude of the amplified sense current, thus adjusting a threshold of the at least one detection Josephson junction in the detection stage 20.

Figure 3:
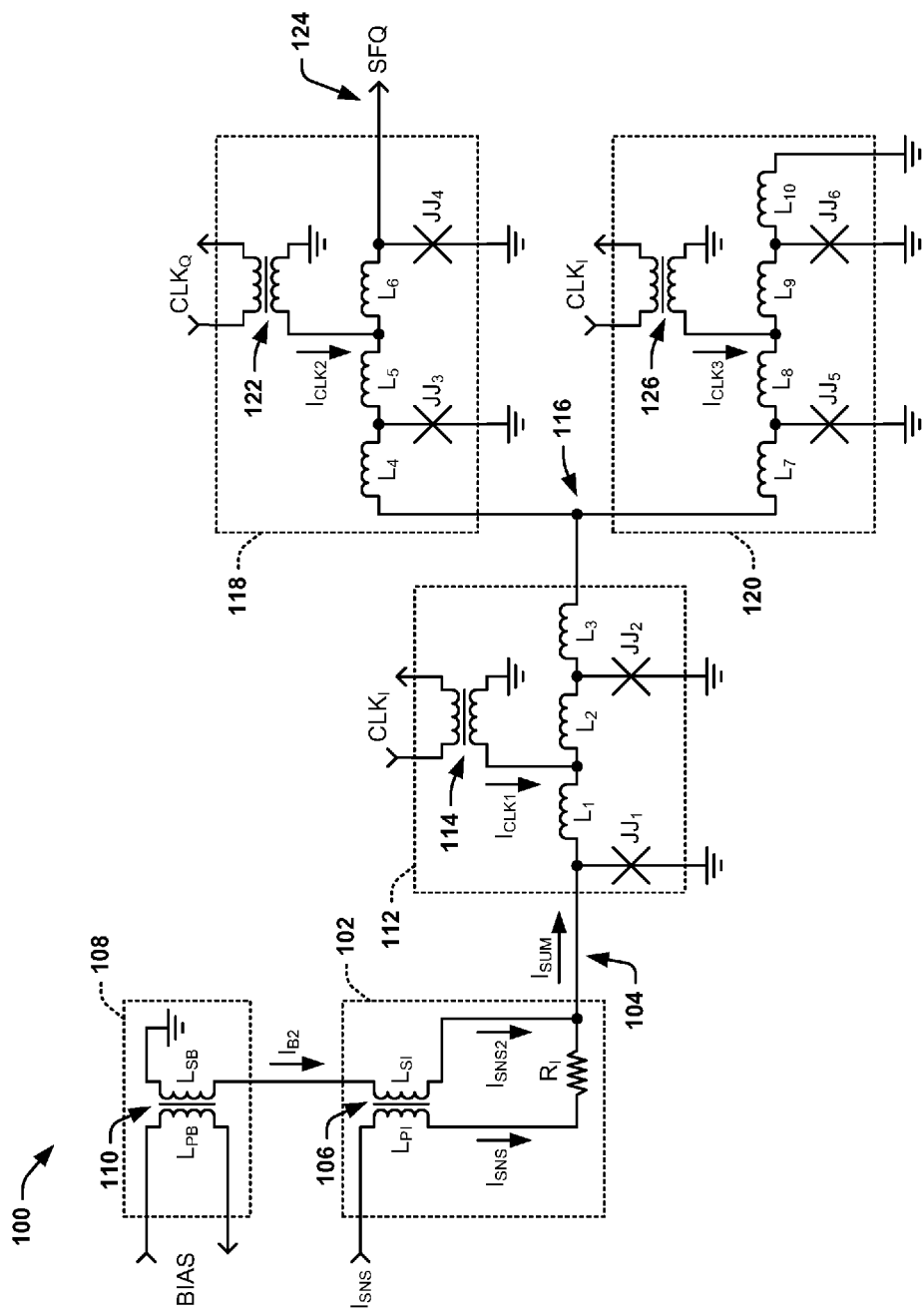
FIG. 3 illustrates an example of an RQL sense amplifier circuit.

FIG. 3 illustrates an example of an RQL sense amplifier circuit 100. The RQL sense amplifier system 100 can correspond to the RQL sense amplifier system 16 in the example of FIG. 1. Therefore, reference is to be made to the example of FIG. 1 in the following description of the example of FIG. 3.

The RQL sense amplifier system 100 includes an input stage 102 that is configured to receive the sense current $I_{SNS}$ from the bit-line and to amplify the sense current $I_{SNS}$ at a summation node 104. In the example of FIG. 3, the input stage 102 includes an input transformer 106 that includes a primary inductor $L_{PI}$ and a secondary inductor $L_{SI}$. The sense current $I_{SNS}$ is provided though the primary inductor $L_{PI}$ to generate an induced sense current $I_{SNS2}$. The sense current $I_{SNS}$ is provided through a resistor $R_I$ to the summation node 104 and is combined with the induced sense current $I_{SNS2}$ at the summation node 104 to generate an amplified sense current $I_{SUM}$. The resistor $R_I$ is configured to provide the sense current $I_{SNS}$ to the summation node 104, and also to provide input impedance of the input stage 102 with respect to the bit-line current $I_{BL}$, such that the bit-line current $I_{BL}$ is steered away from the summation node 104 and to the bit-line of the memory system 10.

The RQL sense amplifier system 100 also includes a bias stage 108 that is configured to modify an amplitude of the amplified sense current at the summation node 104. The bias stage 108 includes a bias transformer 110 that interacts with the input transformer 106. In the example of FIG. 3, the bias transformer 110 includes a primary inductor $L_{PB}$ and a secondary inductor $L_{SB}$. The primary inductor $L_{PB}$ receives the DC bias signal BIAS, such that the secondary inductor $L_{SB}$ generates an induced bias current $I_{B2}$. In the example of FIG. 3, the secondary inductor $L_{SB}$ is arranged in series with the secondary inductor $L_{SI}$. Therefore, the bias current $I_{B2}$ can be additive with respect to the induced sense current $I_{SNS2}$, such as to increase the amplitude of the induced sense current $I_{SNS2}$, and thus the amplitude of the amplified sense current $I_{SUM}$. While the example of FIG. 3 demonstrates the series arrangement of the secondary inductor $L_{SB}$ with respect to the secondary inductor $L_{SI}$, other arrangements are possible. For example, the primary inductor $L_{PB}$ of the bias transformer 110 can be magnetically coupled directly with the secondary inductor $L_{SI}$ of the input transformer 106 to provide an additive effect of the induced sense current $I_{SNS2}$, and thus increasing the amplitude of the amplified sense current $I_{SUM}$.

The RQL sense amplifier system 100 also includes a detection stage 112 that is arranged substantially similar to a JTL. In the example of FIG. 3, the detection stage 112 includes a first clock transformer 114 that is configured to apply a bias current $I_{CLK1}$ to the detection stage 112 based on the in-phase component $CLK_I$ of the clock signal. The detection stage 112 includes a first Josephson junction $JJ_1$ coupled to the summation node 104, and a first inductor $L_1$ and a second inductor $L_2$ between which the bias current $I_{CLK1}$ is provided. The detection stage 112 also includes a second Josephson junction $JJ_2$ coupled to an interconnection of the second inductor $L_2$ and a third inductor $L_3$ that is coupled to a node 116 at an output of the detection stage 112. Thus, in response to the amplified sense current $I_{SUM}$ and based on the in-phase component $CLK_I$, the detection stage 112 is configured to generate an SFQ pulse based on a sequential triggering of the first and second Josephson junctions $JJ_1$ and $JJ_2$. For example, at a positive polarity of the in-phase component $CLK_I$, the bias current $I_{CLK1}$ can provide an activation bias of the first and second Josephson junctions $JJ_1$ and $JJ_2$, such that the amplified sense current $I_{SUM}$ is sufficient to overcome the threshold of the first Josephson junction $JJ_1$ to trigger the first Josephson junction $JJ_1$, which subsequently triggers the second Josephson junction $JJ_2$. Thus, the detection stage 112 provides an SFQ pulse in response to the amplified sense current $I_{SUM}$ at the positive polarity of the in-phase component $CLK_I$.

The RQL sense amplifier system 100 also includes an output JTL 118 and a reset JTL 120 that are each coupled to the node 116. The output JTL 118 and the reset JTL 120 can collectively correspond to the JTL stage 22 in the example of FIG. 1. The output JTL 118 includes a second clock transformer 122 that is configured to apply a bias current $I_{CLK2}$ to the output JTL 118 based on the quadrature-phase component $CLK_Q$ of the clock signal. The output JTL 118 includes a third Josephson junction $JJ_3$ coupled to an interconnection of a fourth inductor $L_4$ and a fifth inductor $L_5$, as well as a sixth inductor $L_6$. The bias current $I_{CLK2}$ is provided between the fifth inductor $L_5$ and the sixth inductor $L_6$. The output JTL 118 also includes a fourth Josephson junction $JJ_4$ coupled to an output 124 of the output JTL 118. Thus, in response to the SFQ pulse generated at the detection stage 112 and based on the quadrature-phase component $CLK_Q$, the output JTL 118 is configured to propagate the SFQ pulse to the output 124 based on a sequential triggering of the third and fourth Josephson junctions $JJ_3$ and $JJ_4$. For example, at a positive polarity of the quadrature-phase component $CLK_Q$, the bias current $I_{CLK2}$ can provide an activation bias of the third and fourth Josephson junctions $JJ_3$ and $JJ_4$, such that the SFQ pulse is sufficient to overcome the threshold of the third Josephson junction $JJ_3$ to trigger the third Josephson junction $JJ_3$, which subsequently triggers the fourth Josephson junction $JJ_4$. Thus, the output JTL 118 propagates the SFQ pulse to the output 124 as the output signal SFQ in response to the SFQ pulse generated at the detection stage 112 at the positive polarity of the quadrature-phase component $CLK_Q$.

The reset JTL 120 includes a third clock transformer 126 that is configured to apply a bias current $I_{CLK3}$ to the reset JTL 120 based on the in-phase component $CLK_I$ of the clock signal. The reset JTL 120 includes a fifth Josephson junction $JJ_5$ coupled to an interconnection of a seventh inductor $L_7$ and an eighth inductor $L_8$, as well as a ninth inductor $L_9$. The bias current $I_{CLK3}$ is provided between the eighth inductor $L_8$ and the ninth inductor $L_9$. The reset JTL 120 also includes a sixth Josephson junction $JJ_6$ interconnecting the ninth inductor $L_9$ and a tenth inductor $L_{10}$ that is grounded. Thus, in response to the SFQ pulse generated at the detection stage 112 and based on the in-phase component $CLK_I$, the reset JTL 120 is configured to propagate an SFQ pulse to ground based on a sequential triggering of the fifth and sixth Josephson junctions $JJ_5$ and $JJ_6$ at a positive polarity of the in-phase component $CLK_I$. Additionally, based on the ground connection of the tenth inductor $L_{10}$, during the negative polarity of the in-phase component $CLK_I$, the fifth and sixth Josephson junctions $JJ_5$ and $JJ_6$ can generate a negative SFQ pulse (e.g., anti-fluxon) that propagates from ground to the node 116. The negative SFQ pulse thus resets the fifth and sixth Josephson junctions $JJ_5$ and $JJ_6$, and propagates to the detection stage 112 to likewise reset the first and second Josephson junctions $JJ_1$ and $JJ_2$. The negative SFQ pulse also propagates to the output JTL stage 118 to reset the third and fourth Josephson junctions $JJ_3$ and $JJ_4$, such as at the negative polarity of the quadrature-phase component $CLK_Q$, and is thus provided at the output 124, such that the output signal SFQ is provided as a fluxon/anti-fluxon pair for use in the associated RQL circuit.

Figure 4:
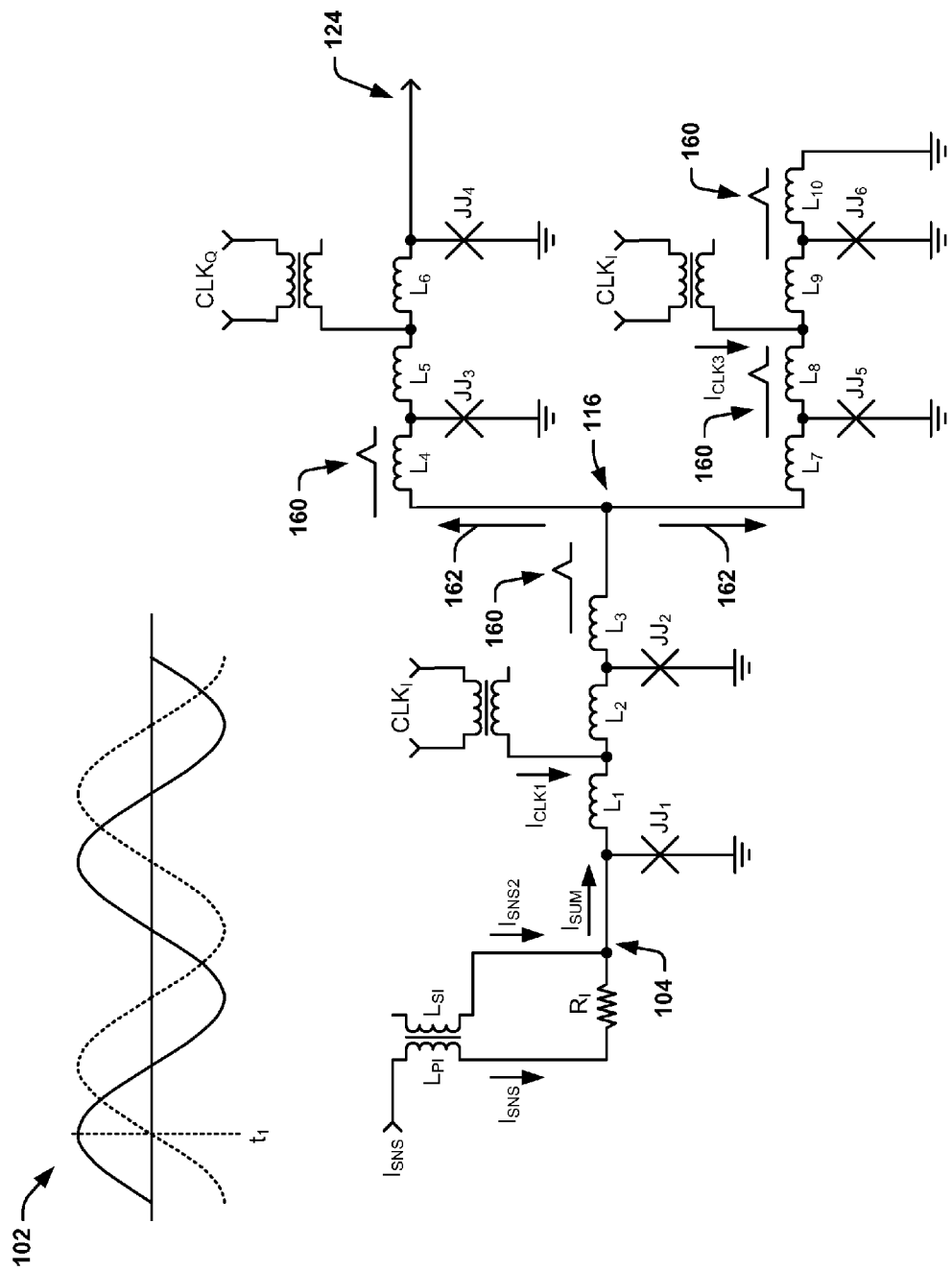
FIG. 4 illustrates an example diagram of the RQL sense amplifier circuit.
Figure 5:
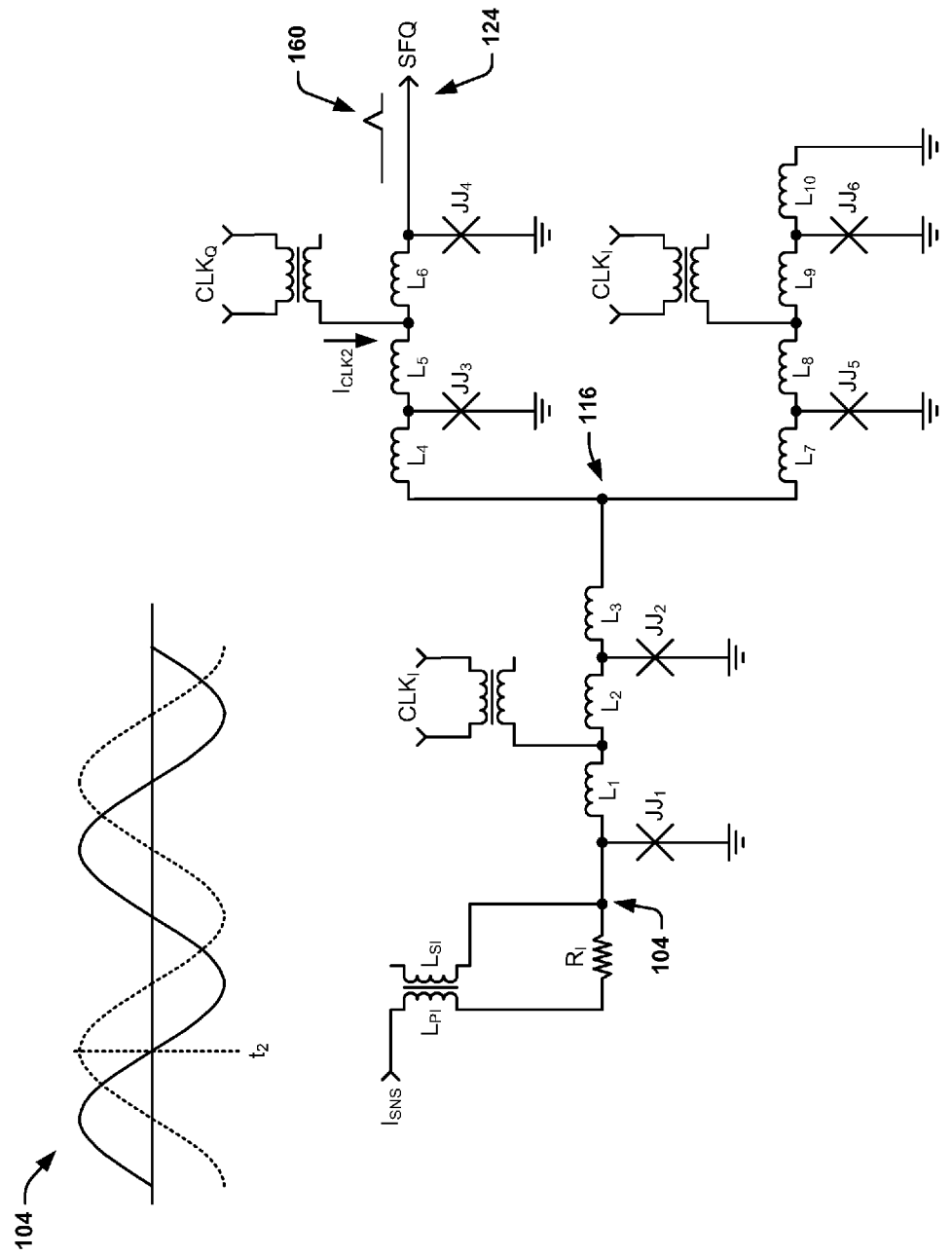
FIG. 5 illustrates another example diagram of the RQL sense amplifier circuit.
Figure 6:
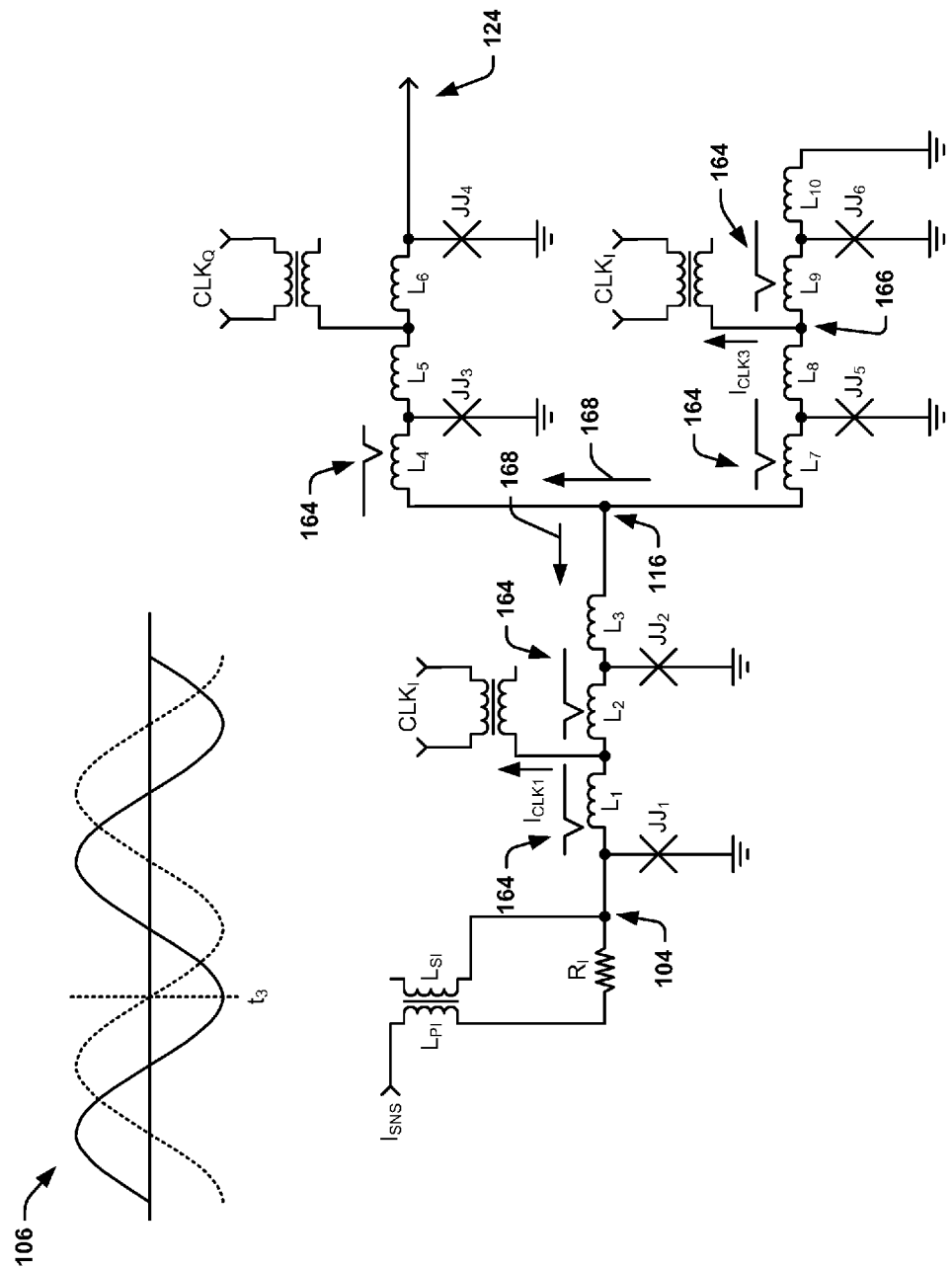
FIG. 6 illustrates yet another example diagram of the RQL sense amplifier circuit.
Figure 7:
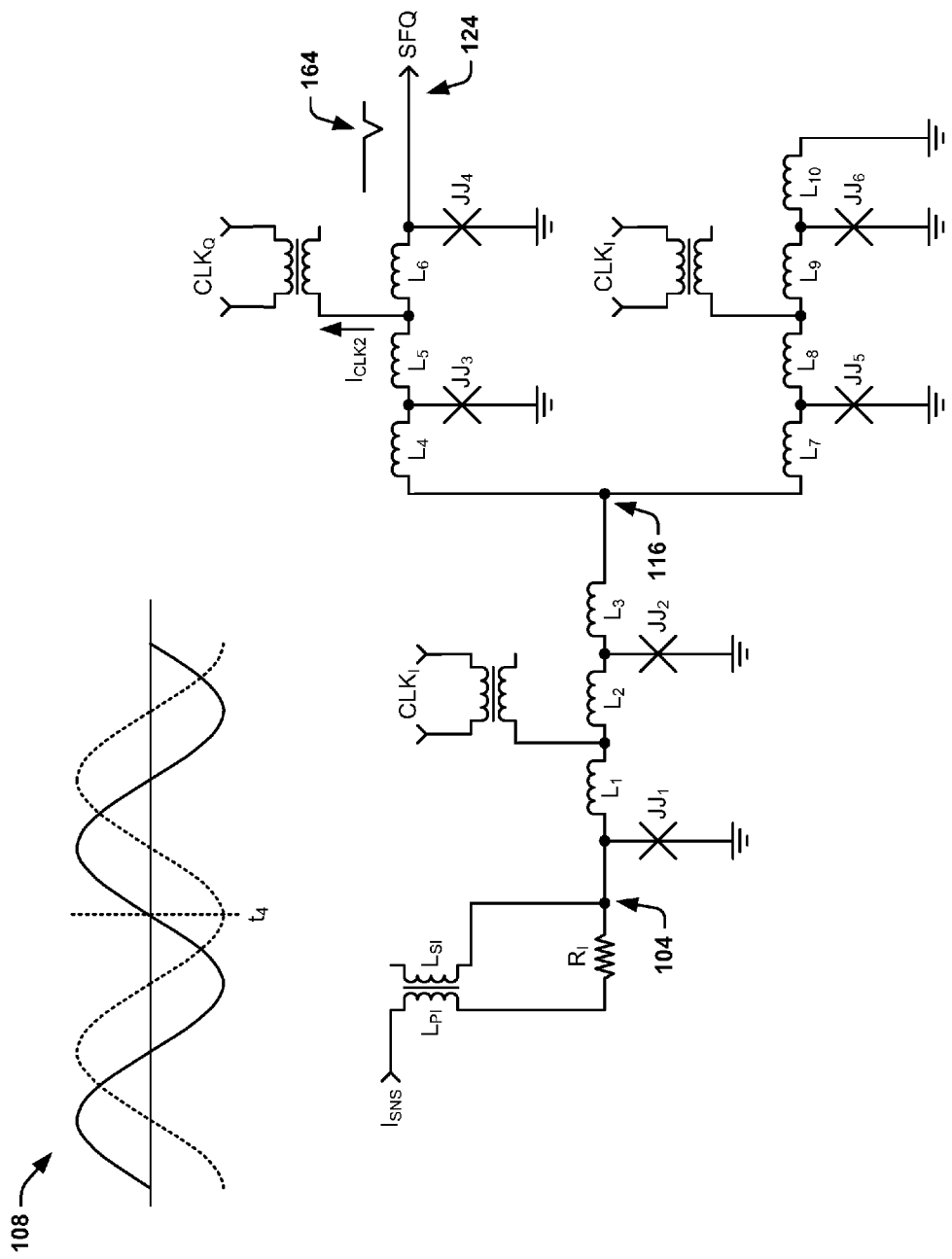
FIG. 7 illustrates yet a further example diagram of the RQL sense amplifier circuit.

The sequential operation of the RQL sense amplifier system 100 is demonstrated in greater detail in the examples of FIGS. 4-7. Thus, FIGS. 4-7 illustrate example diagrams of the RQL sense amplifier system 100 of the example of FIG. 3 at each of different phases of the clock signal CLK. As described in greater detail herein, FIG. 4 illustrates an example diagram 150 of the RQL sense amplifier system 100 at the first phase of the in-phase component $CLK_I$, FIG. 5 illustrates an example diagram 152 of the RQL sense amplifier system 100 at the first phase of the quadrature-phase component $CLK_Q$. Similarly, FIG. 6 illustrates an example diagram 154 of the RQL sense amplifier system 100 at the second phase of the in-phase component $CLK_I$, and FIG. 7 illustrates an example diagram 156 of the RQL sense amplifier system 100 at the second phase of the quadrature-phase component $CLK_Q$. In the examples of FIGS. 4-7, the bias stage 110 has been omitted, as well as the ground connections of the transformers 114, 122, and 126, for clarity and brevity.

In the example of FIG. 4, the sense current $I_{SNS}$ is provided though the primary inductor $L_{PI}$ to generate the induced sense current $I_{SNS2}$. The sense current $I_{SNS}$ is provided through the resistor $R_I$ to the summation node 104 and is combined with the induced sense current $I_{SNS2}$ at the summation node 104 to generate the amplified sense current $I_{SUM}$. In response to the amplified sense current $I_{SUM}$ and based on the bias current $I_{CLK1}$ at the positive polarity of the in-phase component $CLK_I$ at a time $t_1$, the detection stage 112 generates an SFQ pulse 160 at the node 116 based on a sequential triggering of the first and second Josephson junctions $JJ_1$ and $JJ_2$. The SFQ pulse 160 propagates to the fourth inductor $L_4$ in the output JTL 118 and to the seventh inductor $L_7$ in the reset JTL 120, as indicated by the arrows 162. The SFQ pulse 160 thus propagates to ground via the reset JTL 120 based on the bias current $I_{CLK3}$ that is generated via the bias transformer 126 at the time $t_1$.

In the example of FIG. 5, at the time $t_2$, the SFQ pulse 160 is propagated to the output 124. At the time $t_2$, the quadrature-phase component $CLK_Q$ of the clock signal is at the positive polarity (e.g., peak), and thus provides the bias current $I_{CLK2}$. Thus, at the positive polarity of the quadrature-phase component $CLK_Q$, the bias current $I_{CLK2}$ provides an activation bias of the third and fourth Josephson junctions $JJ_3$ and $JJ_4$, such that the SFQ pulse 160 is sufficient to overcome the threshold of the third Josephson junction $JJ_3$ to trigger the third Josephson junction $JJ_3$, which subsequently triggers the fourth Josephson junction $JJ_4$. Accordingly, in response to the SFQ pulse 160 generated at the detection stage 112 at the time $t_1$ and based on the quadrature-phase component $CLK_Q$, the output JTL 118 is configured to propagate the SFQ pulse 160 to the output 124 based on a sequential triggering of the third and fourth Josephson junctions $JJ_3$ and $JJ_4$.

In the example of FIG. 6, at the time $t_3$, a negative SFQ pulse 164 is generated by the reset JTL stage 120. At the time $t_3$, the in-phase component $CLK_I$ of the clock signal is at the negative polarity (e.g., trough), and thus provides the bias current $I_{CLK3}$ at a polarity to provide the current from a node 166 between the inductors $L_8$ and $L_9$. Thus, because the tenth inductor $L_{10}$ is grounded, at the negative polarity of the in-phase component $CLK_I$, the bias current $I_{CLK3}$ provides a reset activation bias of the sixth and fifth Josephson junctions $JJ_6$ and $JJ_5$ to generate the negative SFQ pulse (e.g., anti-fluxon) 164. The negative SFQ pulse 164 thus resets the fifth and sixth Josephson junctions $JJ_5$ and $JJ_6$. The negative SFQ pulse 164 propagates to the detection stage 112 and to the output JTL 118, as demonstrated by the arrows 168. Therefore, the negative SFQ pulse 164 also propagates to the detection stage 112 to likewise reset the first and second Josephson junctions $JJ_1$ and $JJ_2$ at the time $t_3$ based on the bias current $I_{CLK1}$ likewise having an opposite polarity relative to the bias current $I_{CLK1}$ at the time $t_1$.

In the example of FIG. 7, at the time $t_4$, the negative SFQ pulse 164 is propagated to the output 124. At the time $t_4$, the quadrature-phase component $CLK_Q$ of the clock signal is at the negative polarity (e.g., trough), and thus provides the bias current $I_{CLK2}$ at a polarity that is opposite the polarity of the bias current $I_{CLK2}$ at the time $t_2$. Thus, at the negative polarity of the quadrature-phase component $CLK_Q$, the bias current $I_{CLK2}$ provides a reset activation bias of the third and fourth Josephson junctions $JJ_3$ and $JJ_4$, such that the negative SFQ pulse 164 and the bias current $I_{CLK2}$ are sufficient to sequentially reset (e.g., anti-trigger) the third and fourth Josephson junctions $JJ_3$ and $JJ_4$. Accordingly, in response to the negative SFQ pulse 164 generated at the reset stage 120 at the time $t_3$ and based on the quadrature-phase component $CLK_Q$, the output JTL 118 is configured to propagate the negative SFQ pulse 164 to the output 124 based on a sequential reset of the third and fourth Josephson junctions $JJ_3$ and $JJ_4$. Therefore, the negative SFQ pulse 164 follows the SFQ pulse 160 from the output 124 half a clock period later. Accordingly, the SFQ pulse 160 and the negative SFQ pulse 164 collectively correspond to the output signal SFQ that is provided as a fluxon/anti-fluxon pair for use in the associated RQL circuit that is coupled to the output 124 (e.g., via another JTL segment).

Figure 8:
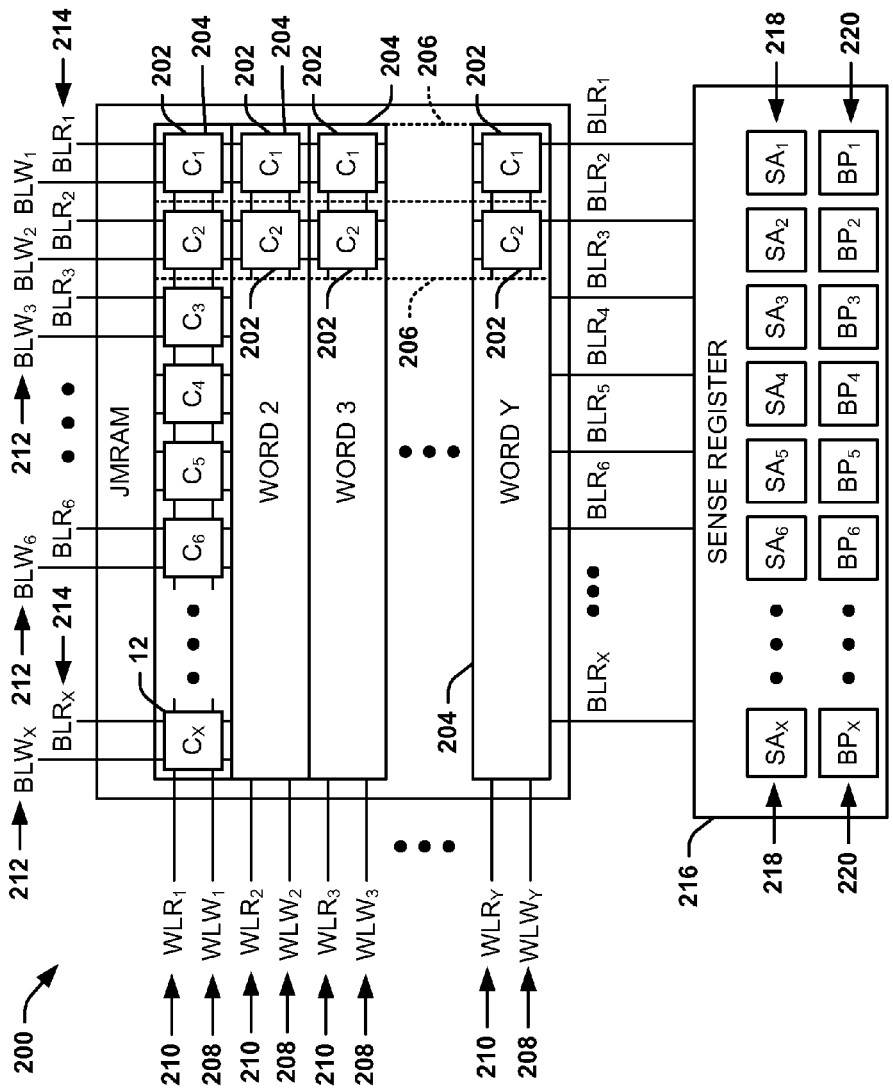
FIG. 8 illustrates another example of a memory system.

FIG. 8 illustrates an example of a memory system 200 in accordance with an aspect of the invention. The memory system 200 can be implemented as a memory structure in a variety of computing applications.

The memory system 200 is demonstrated in the example of FIG. 8 as being arranged as an array of memory cells 202. Specifically, the memory cells 202 are arranged in rows 204 that each correspond to a data word, demonstrated as WORD 1 through WORD Y, where Y is an integer greater than 1. Each of the rows 204 includes a set of memory cells 202 that form X columns 206 across the rows 204, with the memory cells 202 in WORD 1 being demonstrated in the example of FIG. 8 as $C_1$ to $C_X$, where X is an integer greater than 1. Therefore, each of the memory cells 202 in the array of the memory system 200 can be individually addressable by row 204 and column 206.

In the example of FIG. 8, each of the rows 204 is demonstrated as having an associated word-write line 208 and word-read line 210, demonstrated as $WLW_1$ and $WLR_1$ through $WLW_Y$ and $WLR_Y$, respectively. The word-write line 208 and word-read line 210 can be inductively and/or magnetically coupled to each of the memory cells 202 in each of the rows 204 of the memory system 200. In addition, each of the memory cells 202 is demonstrated as having an associated bit-write line 212 and bit-read line 214, demonstrated as $BLW_1$ and $BLR_1$ through $BLW_X$ and $BLR_X$, respectively. The bit-write line 212 and bit-read line 214 can be coupled to each corresponding numbered memory cell 202 in each of the rows 204 of the memory system 200, such that the memory cells 202 in each column 206 are arranged in series with respect to the bit-write line 212 and bit-read line 214. Although the example of FIG. 8 describes that the word-write lines 208 and word-read lines 210 and the bit-write lines 212 and bit-read lines 214 are arranged in series with other adjacent memory cells in the respective row and column, the word-write lines 208 and word-read lines 210 and the bit-write lines 212 and bit-read lines 214 could instead be dedicated with respect to each memory cell 202.

Each of the memory cells 202 is configured to store a single bit of data. Specifically, each of the memory cells 202 can include a hysteretic memory element, such as at least one phase hysteretic magnetic Josephson junction that can be configured to store a digital state corresponding to a binary logic-1 or a binary logic-0. The digital state can be set in response to a word-write current that is provided on the respective word-write line 208 and a bit-write current that is provided on the respective bit-write line 212. Similarly, the respective digital state that is stored in each of the memory cells 202 can be read from the memory cells 202 based on a word-read current that is provided on the respective word-read line 210 to select a given one of the rows 204 and a bit-read current that is provided on the respective bit-read line 214.

In the example of FIG. 8, the bit-read line 214 of each of the columns 206 is coupled to a sense register 216. The sense register 216 includes a plurality X of sense amplifiers 218, demonstrated as "SA", and respective plurality X of bias pumps 220, demonstrated as "BP". Therefore, each of the sense amplifiers 218 and bias pumps 220 are associated with a respective one of the columns 206 of the memory cells 202. The bias pumps 220 that are each configured to generate a bit-read current (e.g., the bit-line current $I_{BL}$ in the example of FIG. 1) on the respective bit-read line 214.

As an example, each of the sense amplifiers 218 can be configured substantially similar to the RQL sense amplifier system 16 in the example of FIG. 1. Therefore, in response to the respective bit-read current, each of the sense amplifiers 218 is configured to measure the respective bit-read line 214 based on the clock signal CLK (e.g., the quadrature clock signal demonstrated in the example of FIG. 2) to determine whether the digital state of each of the memory cells 202 of an associated row 204 correspond to a binary logic-1 state or a binary logic-0 state in response to the word-read current and the bit-read current during a data read operation. As an example, the each of the sense amplifiers 218 can be configured to measure the presence or absence of a respective sense current $I_{SNS}$ associated with the bit-read line 214, as described in the examples of FIGS. 3-7. For example, in the absence of a sense current $I_{SNS}$, the respective sense amplifier 218 can provide no SFQ pulse to indicate a logic-0 state of the associated memory cell. However, in response to detecting the presence of a sense current $I_{SNS}$, such as described in the example of FIGS. 3-7, the respective sense amplifier 218 can provide the SFQ pulse and sequential negative SFQ pulse as the output signal SFQ to indicate a logic-1 state of the associated memory cell. It is to be understood that the logic states could be reversed, as provided by the design of the memory system 200.

Figure 9:
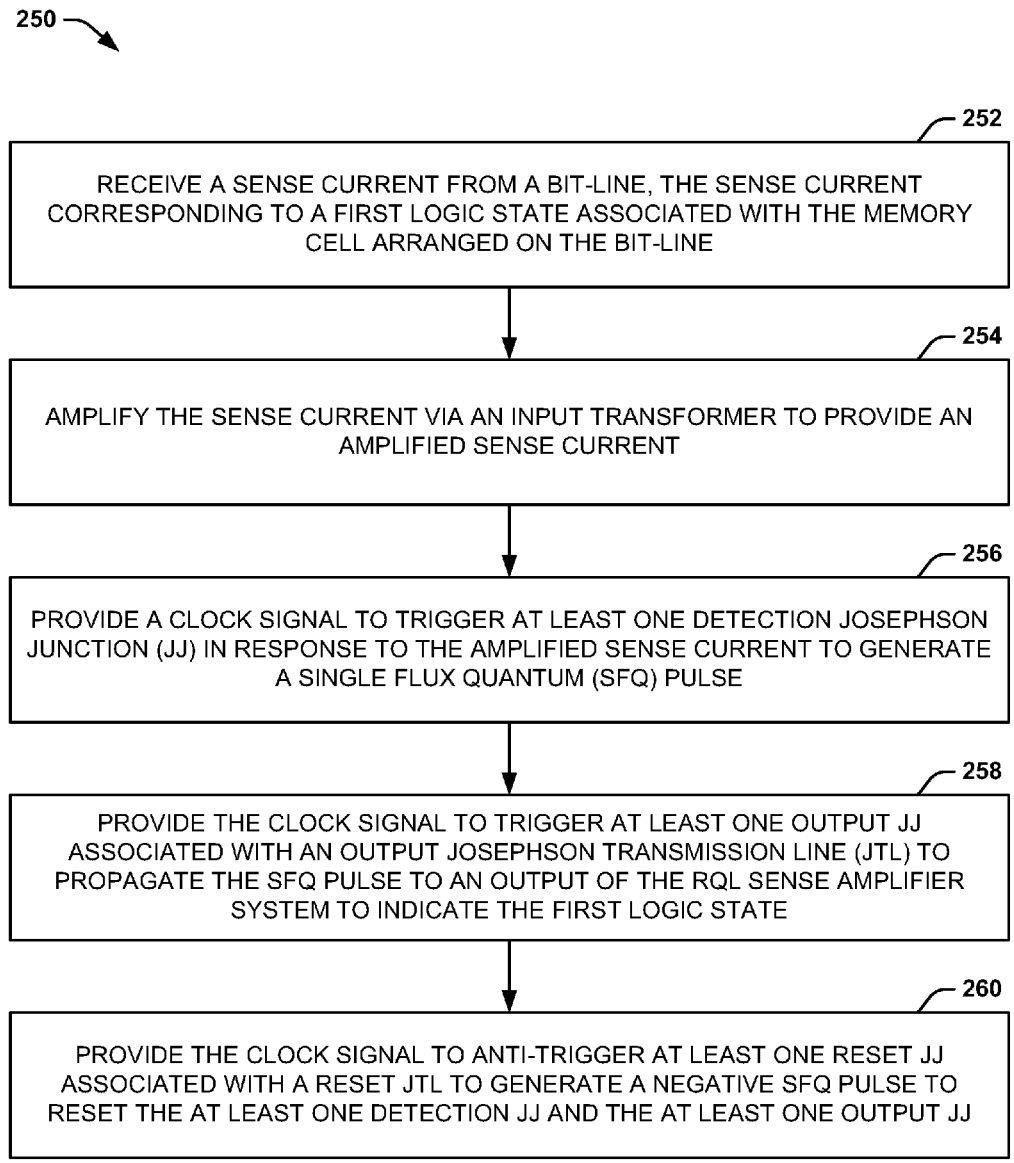
FIG. 9 illustrates an example of a method for reading a logic state in a memory system.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 illustrates an example of a method 250 for reading a memory cell (e.g., memory cell 14) in an RQL memory system (e.g., RQL memory system 10). At 252, a sense current (e.g., sense current $I_{SNS}$) is received from a bit-line. The sense current can correspond to a first logic state (e.g., logic-1 state) associated with the memory cell arranged on the bit-line. At 254, the sense current is amplified via an input transformer (e.g., input transformer 106) to provide an amplified sense current (e.g., amplified sense current $I_{SUM}$). At 256, a clock signal (e.g., clock signal CLK) is provided to trigger at least one detection Josephson junction (e.g., Josephson junctions $JJ_1$ and $JJ_2$) in response to the amplified sense current to generate an SFQ pulse (e.g., SFQ pulse 160). At 258, the clock signal is provided to trigger at least one output Josephson junction (e.g., Josephson junctions $JJ_3$ and $JJ_4$) associated with an output JTL (e.g., output JTL 24) to propagate the SFQ pulse to an output (e.g., output 124) of the RQL sense amplifier system to indicate the first logic state. At 260, the clock signal is provided to anti-trigger at least one reset Josephson junction (e.g., Josephson junctions $JJ_5$ and $JJ_6$) associated with a reset JTL (e.g., reset JTL 26) to generate a negative SFQ pulse (e.g., negative SFQ pulse 164) to reset the at least one detection JJ and the at least one output JJ.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) sense amplifier system comprising:
   an input stage configured to amplify a sense current received at an input;
   a detection stage configured to trigger at least one detection Josephson junction (JJ) in response to the amplified sense current and based on a clock signal to generate a single flux quantum (SFQ) pulse; and
   a Josephson transmission line (JTL) stage configured to propagate the SFQ pulse to an output of the RQL sense amplifier system based on at least one output JJ and to generate a negative SFQ pulse to reset the at least one detection JJ and the at least one output JJ based on the clock signal.

2. The system of claim 1, wherein the input stage comprises an input transformer comprising:
   a primary inductor coupled to the input and being configured to propagate the sense current to a summation node; and
   a secondary inductor magnetically coupled to the primary inductor and electrically coupled to the summation node, the secondary inductor being configured to propagate an induced current that is based on the sense current, such that the induced current and the sense current are combined at the summation node.

3. The system of claim 2, further comprising a bias stage configured to induce a bias current in the secondary inductor based on a DC bias signal to set a threshold of the detection stage based on an amplitude of the amplified sense current.

4. The system of claim 3, wherein the bias stage comprises a bias transformer, the bias transformer comprising:
   a bias primary inductor configured to propagate a bias signal; and
   a bias secondary inductor magnetically coupled to the bias primary inductor and electrically coupled to the secondary inductor, the bias secondary inductor being configured to propagate an induced bias current that is based on the bias signal current, such that the induced bias current is added to the induced current.

5. The system of claim 3, wherein the bias stage comprises a bias inductor that is magnetically coupled to the secondary inductor of the input transformer and is configured to propagate a bias signal, such that secondary inductor is configured to propagate the induced current that is based on the sense current and the bias signal.

6. The system of claim 2, wherein the input stage comprises a resistor interconnecting the primary inductor and the summation node.

7. The system of claim 1, wherein the JTL stage comprises:
   an output JTL coupled to an output of the detection stage and which is configured to propagate the SFQ pulse to the output based on the at least one output JJ; and
   a reset JTL coupled to the output of the detection stage and which is configured to generate the negative SFQ pulse via at least one reset stage JJ to reset the at least one detection JJ and the at least one output JJ based on the clock signal.

8. The system of claim 7, wherein the output JTL interconnects the output of the detection stage and the output of the RQL sense amplifier system to propagate the SFQ pulse based on a first polarity of the clock signal, and wherein the reset JTL interconnects the output of the detection stage and ground to generate the negative SFQ pulse based on a second polarity of the clock signal.

9. The system of claim 7, wherein the clock signal is a quadrature clock signal comprising an in-phase component and a quadrature-phase component, wherein the detection stage comprises a first clock transformer configured to bias the at least one detection JJ based on the in-phase component, wherein the reset JTL comprises a second clock transformer configured to bias the at least one reset JJ based on the in-phase component, and wherein the output JTL comprises a third clock transformer configured to bias the at least one output JJ based on the quadrature-phase component.

10. A memory system comprising the RQL sense amplifier system, the memory system further comprising:
    a bias pump configured to generate a bias current that is provided along a bit-line to which the input of the RQL sense amplifier system is coupled; and
    a plurality of memory cells arranged in a column along the bit-line, each of the plurality of memory cells being addressed by a word-line current provided on one of a respective plurality of word-lines to generate the sense current in response to storing a first logic state and to not generate the sense current on the bit-line in response to storing a second logic state.

11. The memory system of claim 10, wherein the plurality of memory cells are arranged in an array comprising a plurality of columns arranged along a respective plurality of bit-lines and a plurality of rows arranged along the respective plurality of word-lines, wherein the memory system comprises a plurality of RQL sense amplifiers associated with the respective plurality of columns, each of the plurality of RQL sense amplifiers comprising an input coupled to a respective one of the plurality of bit-lines.

12. A method for reading a memory cell in a reciprocal quantum logic (RQL) memory system, the method comprising:
    receiving a sense current from a bit-line, the sense current corresponding to a first logic state associated with the memory cell arranged on the bit-line;
    amplifying the sense current via an input transformer to provide an amplified sense current;
    providing a clock signal to trigger at least one detection Josephson junction (JJ) in response to the amplified sense current to generate a single flux quantum (SFQ) pulse;
    providing the clock signal to trigger at least one output JJ associated with an output Josephson transmission line (JTL) to propagate the SFQ pulse to an output of the RQL sense amplifier system to indicate the first logic state; and
    providing the clock signal to anti-trigger at least one reset JJ associated with a reset JTL to generate a negative SFQ pulse to reset the at least one detection JJ and the at least one output JJ.

13. The method of claim 12, wherein amplifying the sense current comprises adding the sense current that is provided via a primary inductor coupled to the bit-line and an induced sense current that is generated via a secondary inductor that is magnetically coupled to the primary inductor to generate the amplified sense current that is a sum of the sense current and the induced sense current.

14. The method of claim 12, further comprising providing a bias signal to set a threshold of the triggering of the at least one detection JJ in response to the amplified sense current.

15. The method of claim 12, wherein the clock signal is a quadrature clock signal comprising an in-phase component and a quadrature-phase component, wherein providing the clock signal to trigger the at least one detection JJ comprises providing the in-phase component to trigger the at least one detection JJ, wherein providing the clock signal to trigger the at least one output JJ comprises providing the quadrature-phase component to trigger the at least one output JJ.

16. The method of claim 15, wherein providing the clock signal to anti-trigger the at least one reset JJ comprises providing a second polarity of the in-phase component to anti-trigger the at least one reset JJ based on the reset JTL being short-circuited to ground via an inductor.

17. The system of claim 12, further comprising:
providing a word-line current on a word-line associated with the memory cell; and
providing a bit-line current on the bit-line associated with the memory cell, the memory cell being addressed by the word-line current and the bit-line current to generate the sense current in response to storing the first logic state.

18. A memory system comprising a plurality of memory cells arranged in an array of rows and columns, each of the columns comprising:
a bias pump configured to generate a bias current that is provided along a bit-line associated with the respective one of the columns;
a plurality of memory cells arranged along the respective bit-line, each of the plurality of memory cells being addressed by a word-line current provided on one of a respective plurality of word-lines to generate a sense current in response to storing a first logic state and to not generate the sense current on the bit-line in response to storing a second logic state;
a reciprocal quantum logic (RQL) sense amplifier system comprising:
an input stage configured to amplify the sense current and comprising a resistor to steer the bias current generated by the bias pump to the bit-line;
a detection stage configured to trigger at least one detection Josephson junction (JJ) in response to the amplified sense current and based on a clock signal to generate a single flux quantum (SFQ) pulse; and
a Josephson transmission line (JTL) stage configured to propagate the SFQ pulse to an output of the RQL sense amplifier system based on at least one output JJ and to generate a negative SFQ pulse to reset the at least one detection JJ and the at least one output JJ based on the clock signal.

19. The system of claim 18, wherein the input stage comprises an input transformer comprising:
a primary inductor coupled to the bit-line and being configured to propagate the sense current through the resistor to a summation node; and
a secondary inductor magnetically coupled to the primary inductor and electrically coupled to the summation node, the secondary inductor being configured to propagate an induced current that is based on the sense current, such that the induced current and the sense current are combined at the summation node.

20. The system of claim 18, wherein the clock signal is a quadrature clock signal comprising an in-phase component and a quadrature-phase component, wherein the detection stage is configured to trigger at least one detection JJ in response to the amplified sense current and based on a first polarity of the in-phase component to generate the SFQ pulse, wherein the JTL stage comprises:
an output JTL coupled to an output of the detection stage and which is configured to propagate the SFQ pulse to the output based on the at least one output JJ at a first polarity of the quadrature-phase component; and
a reset JTL coupled to the output of the detection stage and which is configured to generate the negative SFQ pulse via at least one reset stage JJ at a second polarity of the in-phase portion to reset the at least one detection JJ and the at least one output JJ based on the clock signal.

* * * * *